United States Patent
Santoleri et al.

(10) Patent No.: US 10,720,539 B2
(45) Date of Patent: Jul. 21, 2020

(54) COEXTRUDED SOLAR PANEL BACKSHEET AND METHOD OF MANUFACTURE

(71) Applicants: E. David Santoleri, Glen Mills, PA (US); Robert F. Davis, Wilmington, DE (US)

(72) Inventors: E. David Santoleri, Glen Mills, PA (US); Robert F. Davis, Wilmington, DE (US)

(73) Assignee: Tomark-Worthen, LLC, Glen Mills, PA (US)

( * ) Notice: Subject to any disclaimer, the term of this patent is extended or adjusted under 35 U.S.C. 154(b) by 0 days.

(21) Appl. No.: 13/626,838

(22) Filed: Sep. 25, 2012

(65) Prior Publication Data

US 2014/0083487 A1    Mar. 27, 2014

(51) Int. Cl.
*H01L 31/049*    (2014.01)
*B32B 27/34*    (2006.01)
(Continued)

(52) U.S. Cl.
CPC .............. *H01L 31/049* (2014.12); *B32B 7/00* (2013.01); *B32B 7/02* (2013.01); *B32B 7/10* (2013.01);
(Continued)

(58) Field of Classification Search
CPC ............... H01L 31/049; H01L 31/0487; H01L 31/0481; H01L 31/0216; H01L 31/048
(Continued)

(56) References Cited

U.S. PATENT DOCUMENTS 5,139,878 A * 8/1992 Kim ..................... B32B 27/08
                                                 428/421
6,335,479 B1 * 1/2002 Yamada ................. B32B 17/10
                                                 136/244
(Continued)

FOREIGN PATENT DOCUMENTS

| CN | 102157591 A | 8/2011 | |
| WO | WO-2011066595 A1 * | 6/2011 | ......... H01L 31/0481 |
| WO | 2012051930 A1 | 4/2012 | |

OTHER PUBLICATIONS

Definition for "Polymer alloy" PAC, 2007, 79, 1801 (Definitions of terms relating to the structure and processing of sols, gels, networks, and inorganic-organic hybrid materials (IUPAC Recommendations 2007)) on p. 1816. (Year: 2007).*

(Continued)

*Primary Examiner* — Andrew J Golden
(74) *Attorney, Agent, or Firm* — Ference & Associates LLC; John W. Goldschmidt, Jr.

(57) ABSTRACT

An improved backsheet used in the construction of solar panels is disclosed. A method of manufacturing the backsheet and solar panel comprising the backsheet, including coextrusion processes are also disclosed. Additionally, a photovoltaic solar panel module comprising the backsheet of the invention is disclosed. The backsheet of the instant invention may comprise an exterior layer having inner and outer surfaces, a middle layer, having inner and outer surfaces, and an interior layer having inner and outer surfaces. In one embodiment of the invention, the outer surface of the middle layer may be adjoined to the inner surface of the exterior layer, and the inner surface of the middle layer may be adjoined to the outer surface of the interior layer. The exterior layer, middle layer, and interior layer may be adjoined via a co-extrusion process, thereby eliminating the need for the use of adhesives for bonding the layers of the
(Continued)

IPA Backsheet Structure backsheet together. The backsheet of the invention improves upon the efficiency, strength, weather resistance, cost, and useful life of the solar panels in which the backsheet is incorporated.

22 Claims, 5 Drawing Sheets (51) Int. Cl.
| | |
|---|---|
| B32B 27/20 | (2006.01) |
| B32B 27/08 | (2006.01) |
| B32B 27/28 | (2006.01) |
| B32B 27/04 | (2006.01) |
| B32B 27/06 | (2006.01) |
| B32B 27/18 | (2006.01) |
| B32B 7/00 | (2019.01) |
| B32B 7/10 | (2006.01) |
| B32B 7/02 | (2019.01) |
| B29C 48/49 | (2019.01) |
| B29C 48/08 | (2019.01) |
| B29C 48/025 | (2019.01) |
| B29C 48/10 | (2019.01) |
| B29C 48/305 | (2019.01) |
| B29C 48/30 | (2019.01) |
| B29C 48/28 | (2019.01) |
| B29C 48/285 | (2019.01) |

(52) U.S. Cl.
CPC .............. *B32B 27/04* (2013.01); *B32B 27/06* (2013.01); *B32B 27/08* (2013.01); *B32B 27/18* (2013.01); *B32B 27/20* (2013.01); *B32B 27/28* (2013.01); *B32B 27/34* (2013.01); *B29C 48/025* (2019.02); *B29C 48/08* (2019.02); *B29C 48/10* (2019.02); *B29C 48/28* (2019.02); *B29C 48/287* (2019.02); *B29C 48/30* (2019.02); *B29C 48/307* (2019.02); *B29C 48/49* (2019.02); *B32B 2250/03* (2013.01); *B32B 2250/24* (2013.01); *B32B 2250/40* (2013.01); *B32B 2307/40* (2013.01); *B32B 2307/4026* (2013.01); *B32B 2307/416* (2013.01); *B32B 2307/54* (2013.01); *B32B 2307/546* (2013.01); *B32B 2307/712* (2013.01); *B32B 2457/00* (2013.01); *B32B 2457/12* (2013.01); *Y02E 10/50* (2013.01); *Y10T 428/24967* (2015.01); *Y10T 428/269* (2015.01); *Y10T 428/31725* (2015.04); *Y10T 428/31728* (2015.04)

(58) Field of Classification Search
USPC .......................... 136/244–265; 428/421, 457
See application file for complete search history.

(56) References Cited

U.S. PATENT DOCUMENTS

| | | | |
|---|---|---|---|
| 6,660,930 B1* | 12/2003 | Gonsiorawski | ....... H01L 31/049 136/244 |
| 7,238,878 B2 | 7/2007 | Gonsiorawski | |
| 7,338,707 B2 | 3/2008 | Kernander et al. | |
| 2004/0144415 A1 | 7/2004 | Arhart | |
| 2006/0057392 A1 | 3/2006 | Smillie et al. | |
| 2008/0000517 A1* | 1/2008 | Gonsiorawski | ....... H01L 31/048 136/246 |
| 2008/0053512 A1* | 3/2008 | Kawashima | .......... H01L 31/048 136/244 |
| 2008/0053516 A1 | 3/2008 | Hayes | |
| 2008/0124556 A1* | 5/2008 | Kernander et al. | ........... 428/421 |
| 2009/0298372 A1* | 12/2009 | Chou | ..................... B32B 27/28 442/288 |
| 2010/0119841 A1* | 5/2010 | Muckenhuber | ....... H01L 31/048 428/423.5 |
| 2011/0036390 A1 | 2/2011 | Nelson et al. | |
| 2011/0083726 A1* | 4/2011 | Takayanagi | ........... H01L 31/049 136/251 |
| 2011/0146758 A1 | 6/2011 | Trouilhet et al. | |
| 2011/0315199 A1 | 12/2011 | Vogt et al. | |
| 2012/0028060 A1* | 2/2012 | Etzel | ................... H01L 31/0481 428/473.5 |
| 2012/0160321 A1 | 6/2012 | Hull et al. | |
| 2012/0192944 A1 | 8/2012 | Aoyama et al. | |
| 2012/0255611 A1* | 10/2012 | Mikats | ................ H01L 31/0481 136/259 |
| 2012/0325293 A1* | 12/2012 | Nattermann | .......... H01L 31/049 136/251 |
| 2013/0172488 A1* | 7/2013 | Chou | .................. C08L 23/0876 525/183 |
| 2013/0209795 A1 | 8/2013 | Lin | |

OTHER PUBLICATIONS

Definition for "Compatible Polymer blend" PAC, 2007, 79, 1801 (Definitions of terms relating to the structure and processing of sols, gels, networks, and inorganic-organic hybrid materials (IUPAC Recommendations 2007)) on p. 1817. (Year: 2007).*

* cited by examiner

COEXTRUDED SOLAR PANEL BACKSHEET AND METHOD OF MANUFACTURE

FIELD OF THE INVENTION

This invention is directed to a backsheet used in the construction of photovoltaic solar panels. More specifically, this invention is directed to a coextruded backsheet used in the construction of photovoltaic solar panels. The invention is further directed to a method for producing coextruded backsheets, and a solar cell incorporating such a backsheet.

BACKGROUND OF THE INVENTION

Photovoltaic solar panels modules on the market today typically comprise a front cover, a first layer of encapsulant, one or more photovoltaic cells, a second layer of encapsulant, and a layer of insulation adjacent to the second layer of encapsulant on the backside of the solar panel module. The insulation layer is intended to provide electrical insulation for safety, and prevent performance problems such as current leakage or potential short circuits. This insulation layer is generally referred to in the trade as a "backsheet."

Figure 1:
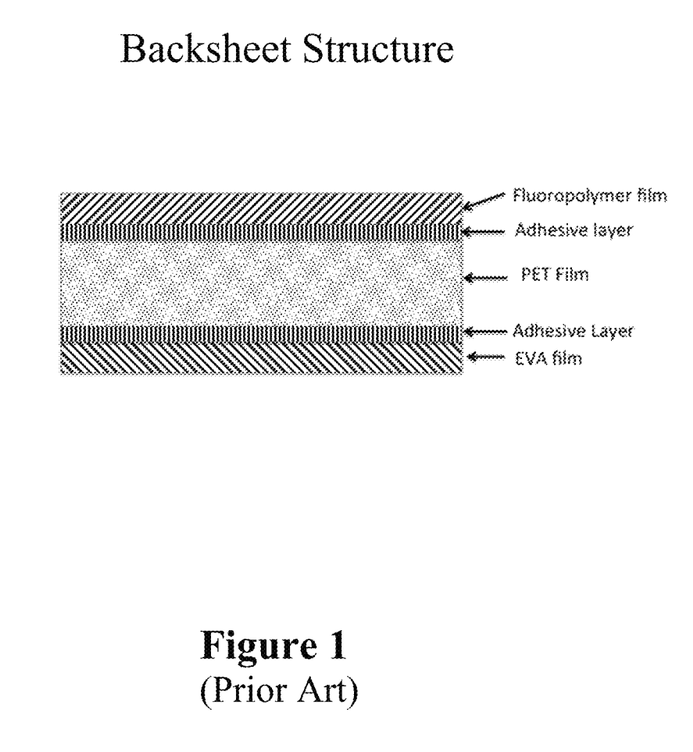
FIG. 1 is a cross sectional schematic of the layers of a prior art embodiment of a solar panel backsheet.

Over the last two decades, this insulation layer, or backsheet, has been primarily constructed as a three layer laminate structure that utilizes: (i) a fluoropolymer exterior layer; (ii) a bi-axially oriented polyester (hereinafter "PET") core layer; and (iii) either another fluoropolymer layer, or an olefin adhesive layer such clarified polyethylene (hereinafter "PE") or ethylene vinyl acetate (hereinafter "EVA") film. This type of backsheet construction is depicted in FIG. 1.

The function of the fluoropolymer layer is solely to provide long term ultraviolet ("UV") protection of the internal PET layer. Fluoropolymers are well known to provide excellent outdoor weather resistance and long term durability. However, fluoropolymers are fairly expensive components, and under most conditions the useful life of the fluoropolymer layer will far exceed the life of the solar panel.

The PET core layer of the typical backsheet serves two functions: (i) providing excellent insulation characteristics; and (ii) providing excellent dimensional stability. Both properties are critical to successful backsheet performance and need to be maintained over the life of the panel.

The third layer of the current backsheet also provides several functions: (i) it enables a durable bond between the module encapsulant material and the backsheet; (ii) it provides enhanced reflectivity to improve the solar panel module efficiency; and (iii) it also serves as part of the total laminate dielectric material.

Historically the backsheet described above has been made with individual films that are laminated together with various adhesives. The adhesive selection is critical as it has proven to be one of the major weak links in the backsheet and module structure, causing inter layer adhesion issues in the field. Recently the fluoropolymer exterior layer has been applied using a fluoropolymer coating instead of the traditional film. This approach has proven to have two major advantages: first the elimination of one adhesive layer; and, second, the ability to reduce the fluoropolymer layer thickness, thereby reducing the overall cost of manufacturing the solar panel module.

It should be noted, however, that the PET layer, while being an excellent insulator with good dimensional stability, does have some negative characteristics. PET has both poor UV resistance and hydrolysis resistance, which often results in premature failure of the backsheet.

Recently, however, the introduction of backsheets using a PET exterior layer has captured significant market share. These backsheets are made with a special PET exterior layer that has been modified to improve both UV properties and reduce hydrolysis concerns. The interior layer used the same unmodified PET used in the fluoropolymer-based backsheets along with the same olefin adhesive layer. The result is a fairly low cost backsheet that may be adequate when used in some applications. However, this construction is also made with adhesive layers and is subject to interlayer adhesion failures. Even though the PET exterior layer may be modified to perform better than an unmodified PET layer, the reality is that this backsheet is likely to prove to be unsatisfactory over time.

More recently, backsheets based on polyamides have been introduced to the solar panel market. The initial products introduced to the market were based on various layers of polyamides, with the exterior layers being modified with UV absorbers and fillers to provide some facsimile of UV stability. In general, polyamide is not considered for exterior applications due to poor UV stability. These constructions were made with the same lamination process found in other backsheets and are also subject to interlayer adhesion issues. In this regard, long chain polyamides are generally required in backsheet application due to the fact that shorter chain nylons absorb moisture more readily than the long chain polyamides. Short chain nylons can usually absorb up to about 6.5% moisture, which moisture could adversely affect the electrical insulation properties of the backsheet. Although long chain nylons may perform better with the best absorbing only about 2% moisture, long chain nylons are very expensive and add significant cost to the backsheet.

Accordingly, solar panel backsheets currently in use today exhibit several characteristics which leave room for improvement. First, the use of a fluoropolymer layer is costly and is over-engineered in typical solar panel applications. Secondly, on the opposite side of the spectrum, the modified PET or modified polyamide is a high risk for use in the PV system, since it will fail prematurely in many applications causing panels to potentially be unsafe and inefficient. Additionally, a solar panel system that incorporates the use of adhesives is prone to problems in manufacturing as well as subject to premature failure in the field.

Thus, there exists a need for an efficient, durable, weather resistant, and cost effective backsheet used in the construction of solar panel systems. There also exists a need for a solar panel backsheet which eliminates the use of adhesives in the backsheet construction. The need also exists for an efficient and cost effective method for manufacturing such improved solar panel backsheets.

SUMMARY OF THE INVENTION

The need for providing an efficient, durable, weather resistant, and cost effective backsheet which eliminates the use of adhesives used in the construction of photovoltaic solar panel systems is achieved by the backsheet and of this invention. Moreover, the need for providing an efficient method for manufacturing such improved solar panel backsheets, is also achieved by the method of this invention.

The backsheet of this invention may include, but may not be limited to an exterior layer having inner and outer surfaces, a middle layer, having inner and outer surfaces, and an interior layer having inner and outer surfaces. In one embodiment of the invention, the outer surface of the middle layer may be adjoined to the inner surface of the exterior layer, and the inner surface of the middle layer may be adjoined to the outer surface of the interior layer. The exterior layer, middle layer, and interior layer may be adjoined via a co-extrusion process, thereby eliminating the need for the use of adhesives for bonding the layers of the backsheet together. The backsheet of the invention improves upon the efficiency, strength, weather resistance, cost and useful life of the solar panels in which the backsheet is incorporated.

The method of manufacturing the solar panel of this invention may include, but may not be limited to a coextrusion, blown film or other suitable manufacturing processes, which do not principally rely upon adhesives to join the layers of the backsheet together, although suitable adhesives may be employed between any two layers of the backsheet.

In one embodiment the backsheet of this invention may be produced by first drying an exterior layer material comprising a polyamide and ionomer alloy, a middle layer material comprising a talc (or other suitable filler material) filled polyamide, and an interior layer material comprising a polyamide and ionomer alloy. The exterior, middle and interior layer materials are then heated to a state wherein each material may be extruded into individual sheets or webs. The exterior, middle and interior layer materials are then each extruded into individual sheets or webs. The individual sheets or webs are then joined together to form the backsheet if this invention. The backsheet comprises a single, three layered sheet or web which layers comprise the exterior layer material sheet or web, the middle layer material sheet or web, and the interior layer sheet or web. The outer surface of the middle layer sheet or web is adjoined to the inner surface of the exterior layer sheet or web, and the inner surface of said middle layer is adjoined to the outer surface of the interior layer sheet or web.

BRIEF DESCRIPTION OF THE DRAWINGS

Understanding of the present invention will be facilitated by consideration of the following detailed description of the embodiments of the present invention taken in conjunction with the accompanying drawings, in which like numerals refer to like parts, and wherein.

DETAILED DESCRIPTION OF THE EMBODIMENTS

It is to be understood that the figures, images and descriptions of the present invention have been simplified to illustrate elements that are relevant for a clear understanding of the present invention, while eliminating, for the purposes of clarity, many other elements which may be found in the present invention. Those of ordinary skill in the pertinent art will recognize that other elements are desirable and/or required in order to implement the present invention. However, because such elements are well known in the art, and because such elements do not facilitate a better understanding of the present invention, a discussion of such elements is not provided herein.

Figure 2:
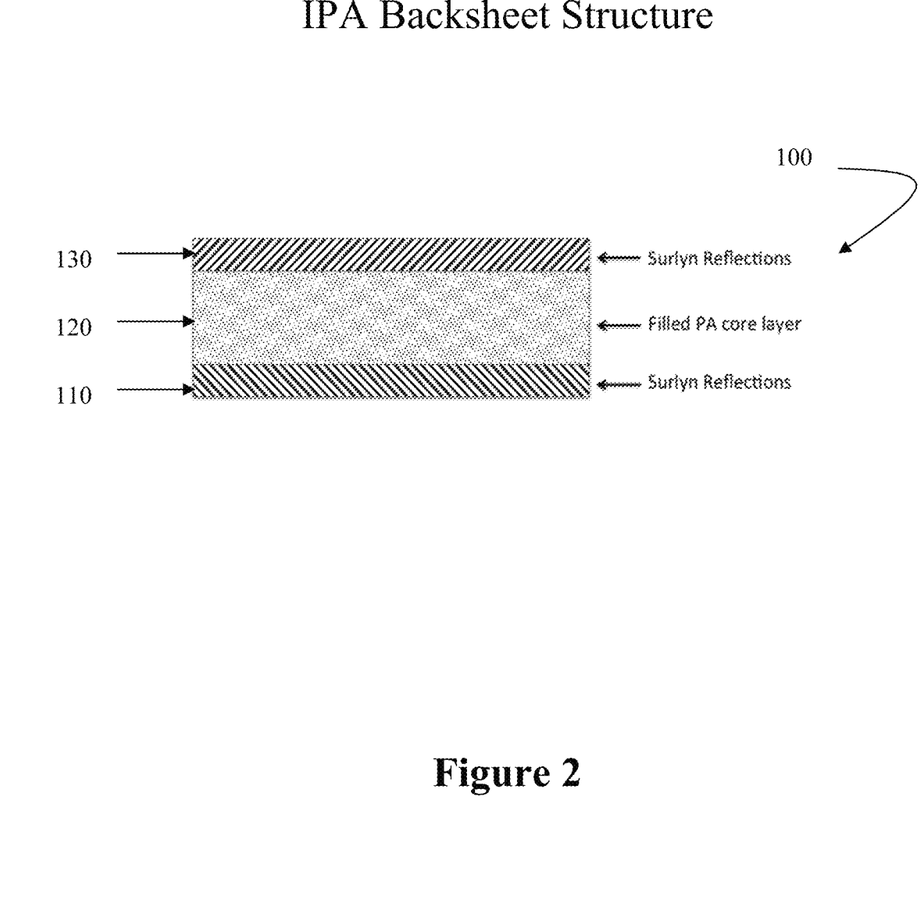
FIG. 2 is a cross sectional schematic of the layers of one embodiment of the solar panel backsheet of the instant invention.

Turning now to FIG. 2, there is shown a cross sectional schematic of backsheet 100 of one embodiment of the instant invention. Backsheet 100 may comprise exterior layer 110 having inner and outer surfaces, middle layer 120 having inner and outer surfaces, and interior layer 130 having inner and outer surfaces. In this embodiment of backsheet 100, the outer surface of middle layer 120 may be adjoined to the inner surface of exterior layer 110, and the inner surface of middle layer 120 may be adjoined to the outer surface of interior layer 130. In one embodiment of the invention, and as discussed below, exterior layer 110, middle layer 120 and interior layer 130 may be adjoined via a co-extrusion process therein eliminating the need for the use of adhesives for bonding the layers of backsheet 100 together.

Backsheet 100 of the instant invention eliminates many of the deficiencies found in known laminated backsheets while reducing the overall cost of producing backsheet 100. Backsheet 100 of this invention utilizes materials which are more cost effective than fluoropolymers used in the exterior layer of known backsheets, and provide better weather resistant properties than those of PET. Moreover, backsheet 100 of this invention is made with no interlayer adhesives.

In one embodiment of the invention, backsheet 100 may be made via a co-extrusion process that enables multiple layers of various materials to be extruded through one die therein producing a final backsheet 100 structure in one step or continuous process. Backsheet 100 may comprise three layers, each providing the functionality needed to perform as a highly durable, cost effective backsheet. The three layer structure of backsheet 100 may comprise a weatherable exterior layer 110, a dimensionally stable insulating solar module encapsulant core layer 120, and the third interior layer 130 which bonds to core layer 120.

In yet another embodiment of the invention, exterior layer 110 of backsheet 100 may comprise Surlyn Reflections™. Surlyn Reflections™ is a polyamide and ionomer alloy available through DuPont, and is manufactured under license from DuPont by LTL compounders in Morrisville, Pa.

Generally, Surlyn Reflections™ has been used in exterior automotive applications, and offers excellent weather resistance and excellent UV performance. Surlyn Reflections™, an alloy of polyamide and ionomer, uses proprietary compatibilizers to result in a resin that is particularly homogenous and stable. Polyamide in the alloy offers the material excellent mechanical properties, and the ionomer offers excellent toughness and UV resistance. The presence of the ionomer in the alloy also greatly reduces the moisture pick up normally seen in available polyamide compositions. In addition, the ionomer present in Surlyn Reflections™ is a olefinic material that does not absorb moisture and has excellent adhesion to other materials. Thus, the use in of the Surlyn Reflections™ product in PV applications provides a well engineered exterior layer 110 when compared to exterior backsheet layers currently being employed in PV applications.

In addition, exterior layer 110 comprising Surlyn Reflections™ may be pigmented to provide any color desired, such as white or black depending on where the solar panel is being deployed and whether or not additional absorption or reflection is desired. Compatibilized alloys of other lower cost olefins such as polyethylene or polypropylene may also be utilized, however, the ionomer offers advantages in the adhesion of junction boxes to the backsheet and higher temperature stability. In one embodiment of the invention, exterior layer 110 may comprise black Surlyn Reflections™.

Middle layer 120 may comprise a talc filled polyamide (hereinafter "PA"). PA610, PA612, PA11, PA12 and PA9T all are acceptable alternative materials to be used for middle layer 120. One of the preferred materials which may be used as middle layer 120 may comprise either PA612, due to its low cost, or PA610, due to it being a bio-based, renewable and environmentally friendly polymer material, also of relatively low cost. In one embodiment, PA610 may comprise up to about sixty-five percent (65%) renewable materials. In one such embodiment of PA610, such renewable materials may be derived from castor bean oil.

Middle layer 120 may also provide excellent dielectric properties, dimensional stability and higher temperature functionality than known backsheets. The nylons can be filled between about ten (10%) and about forty (40%) with talc, with the preferred loading being about twenty-five (25%).

Like exterior layer 110, interior layer 130 of backsheet 100 may also comprise polyamide and ionomer alloy layer, such as Surlyn Reflections™. In general, the layer facing the PV cells provides for more efficient operation in the solar panel module when interior layer 130 has enhanced reflectivity. It has been observed improvement in overall solar panel efficiency of up to about five percent (5%) over dark colored backsheets when backsheet 100 of this invention is used.

In this regard, interior layer 130 may comprise a highly reflective white polyamide and ionomer alloy layer, such as Surlyn Reflections™, which exhibits good bonding characteristics, and bonds particularly well to EVA encapsulant, providing bond strengths of over about 70 N/cm. Although interior layer 130 may comprise a more traditional clarified PE or EVA, the use of a highly reflective, white, polyamide and ionomer alloy layer, such as Surlyn Reflections™, provides an interior layer 130 that has a melting point above about one hundred fifty degrees Celsius (150° C.) and, therefore, does not ooze during the panel lamination process. In this regard, backsheets that incorporate an EVA layer are subject to the EVA layer flowing during the panel lamination inasmuch as EVA has a melting point below the typical one hundred forty degrees Celsius (140° C.) to one hundred fifty degrees Celsius (150° C.) typically used in panel lamination processes. In one embodiment of the invention, interior layer 130 may comprise black Surlyn Reflections™.

In yet another embodiment of backsheet 100 of the instant invention, backsheet 100 comprises three coextruded layers for use in a solar module. In this embodiment, backsheet 100 serves, in part, as exterior insulation for a photovoltaic solar panel. In one embodiment of the invention, of backsheet 100 may comprise the following layers:

1. The Interior Layer

The inner surface of interior layer 130 is in contact with the outer surface or bottom surface of the encapsulant layer of the PV module, and may comprise an ionomer resin intimately alloyed with nylon resin, and may also comprise between about two percent (2%) to about fifteen percent (15%) by weight of titanium dioxide white pigment, or other suitable amount. In this embodiment, interior layer 130 may also contain a UV absorber package, particularly if the encapsulant layer is devoid of such an additive, however such additives my be present in both interior layer 130 and the encapsulant layer of the PV cell. The ionomer resin may be zinc or sodium based, while the nylon may comprise, for example, nylon 6, nylon 66, nylon 610, or nylon 612.

Although interior layer 130 may be of any suitable thickness, in one embodiment of the invention, interior layer 130 may have a thickness of between about twelve microns (12µ) and about 205 microns (205µ). Non-conductive carbon black pigment may also be used to make interior layer 130 darker or black. Infrared reflecting pigments may also be used to reduce the temperature to the extent that interior layer 130 is a darker color. Also, specialty pigments may also be used to achieve desired colors in interior layer 130.

Moreover, interior layer 130, positioned next to the bottom layer of encapsulant, may also comprise a suitable amount of EVA resin. In one embodiment of the invention, the percentage of VA may range from about zero percent (0%) to about eight percent (8%) by weight. This composition may also receive the same pigments and other additives as the ionomer/nylon alloy.

2. The Middle Layer

Middle layer 120 of backsheet 100 may comprise either nylon 11, nylon 12, nylon 610, or nylon 612 and may contain any suitable amount of filler. However, in one embodiment of the invention, middle layer 120 may comprise between about five percent (5%) to about forty percent (40%) filler. The filler may comprise talc, calcium carbonate, any combination of talc and calcium carbonate, or other suitable materials. Middle layer 120 may also contain pigments such as $TiO_2$ or carbon black. In one embodiment of the invention, middle layer 120 may comprise about one half of one percent (0.5%) to about eight percent (8%) of pigment.

Middle layer 120 may be of any suitable thickness, however in one embodiment of the invention, middle layer 120 may have a thickness of between about seventy-five microns (75µ) and about one-hundred eighty microns (180µ).

3. The Exterior Layer

Exterior layer 110 may comprise an ionomer resin intimately alloyed with nylon resin, and which may also contain a suitable amount of pigment. In one embodiment of the invention, exterior layer 110 may comprise between about four percent (4%) to about fifteen percent (15%) titanium dioxide pigment. A UV absorber may also be added. The ionomer resin may comprise sodium based or zinc based ionomer, while the nylon resin may comprise nylon 6, nylon 66, nylon 610, or nylon 612. Although of exterior layer 110 may be of any suitable thickness, in one embodiment of the invention, of exterior layer 110 may have a thickness of between about twelve microns (12µ) and about 205 microns (205µ).

Non-conductive carbon black pigment may also be used to make exterior layer 110 black. Infrared reflecting pigments may also be used to reduce the temperature when exterior layer 110 is a dark color. In addition, specialty pigments to achieve desired colors may also be used.

In at least one embodiment of the method of the instant invention, backsheet 100 may be constructed using a co-extrusion process. To achieve improved bonds between each layer of backsheet 100 of this invention, the materials comprising the layers of backsheet 100 generally may be characteristically compatible and have melting points that are similar enough so that each material is generally contemporaneously molten, and the process temperature at any given time in the process does not cause degradation of the material having the lower melting temperature.

Figure 3:
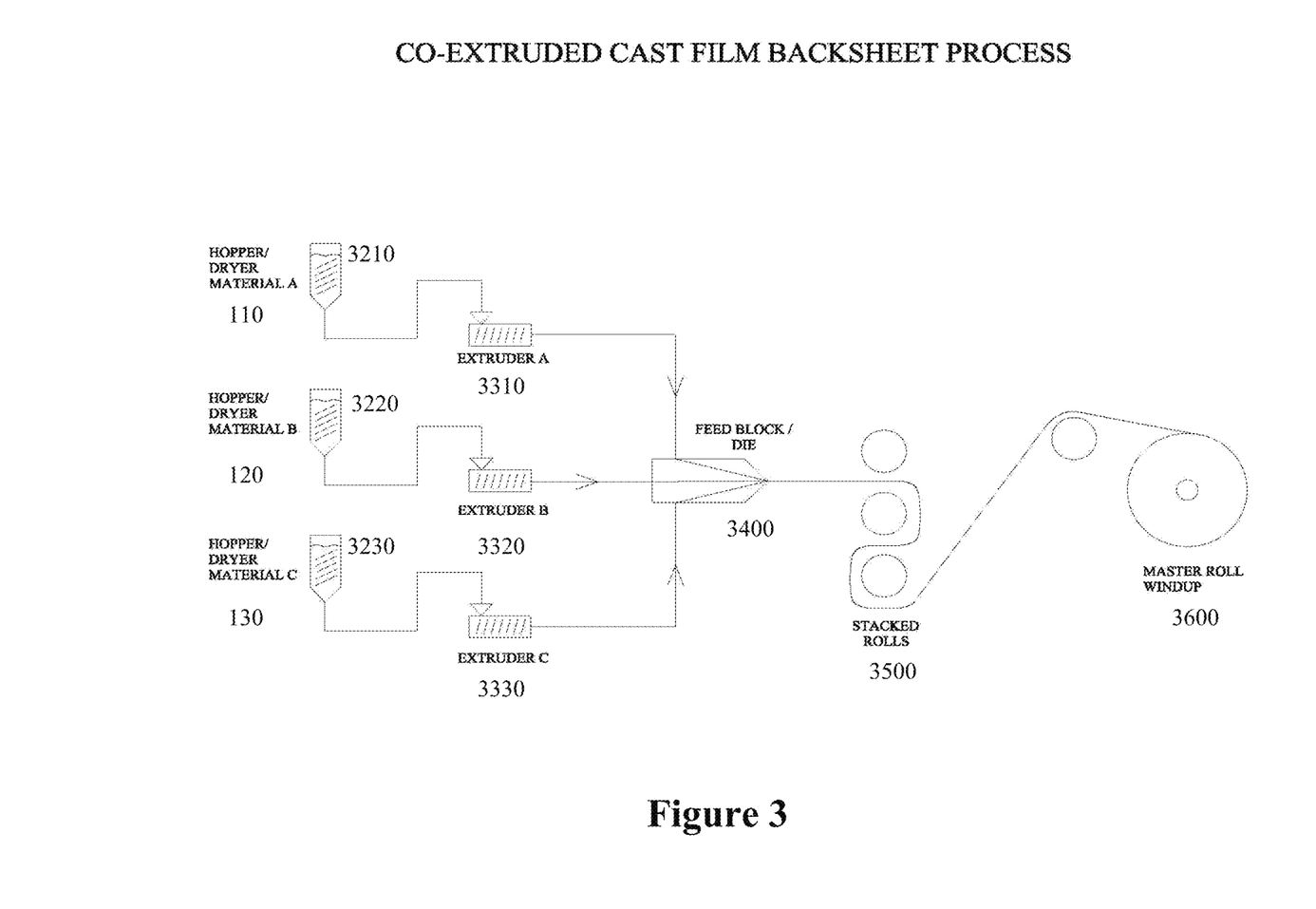
FIG. 3 is a block diagram depicting one embodiment of a method of manufacturing the backsheet of the instant invention via a cast film process.

Turning now to FIG. 3, there is shown a block diagram depicting one embodiment of a method for manufacturing backsheet 100 which utilizes a co-extruded cast film process. Backsheets 100 made by the processes described herein have demonstrated excellent performance in actual testing. In one embodiment of the instant invention, when used as exterior layer 110 and interior layer 130 layer, Surlyn Reflections™ has been found to be compatible with other polyamides, such as a talc filled, thermally stable polyamide which may comprise middle layer 120, although other suitable materials may be used for exterior layer 110, middle layer 120 and interior layer 130.

In a first example of the co-extrusion process of the instant invention depicted in FIG. 3, backsheet 100 was manufactured by utilizing three following three layers of material:
(1) an exterior layer 110 (designated as Material A in FIG. 3) of white Surlyn Reflections material comprising about ten percent (10%) $TIO_2$;
(2) a middle layer 120 (designated as Material B in FIG. 3) of PA612 (Dupont 158NC010) comprising about twenty-five percent (25%) talc filler; and
(3) an interior layer 130 (designated as Material C in FIG. 3) of the same white Surlyn Reflections, comprising about ten percent (10%) $TIO_2$, as that of exterior layer 110.

The Surlyn Reflections material utilized for both exterior layer 110 and interior layer 130 was dried for between about 4 to about 6 hours at about seventy degrees Celsius (70° C.) to bring the moisture content in the materials to below about 0.15% by weight in desiccant hopper/dryers 3210 and 3230, respectively. The PA612 material utilized for middle layer 120 was dried for between about 4 to about 6 hours at about eighty degrees Celsius (80° C.) to bring the moisture content in the materials to below about five hundredths of a percent (0.05%) by weight in desiccant hopper/dryer 3220.

Dried pellets of each material were conveyed pneumatically from hopper/dryers 3210, 3220 and 3230, respectively, to the corresponding extruders 3310, 3320 and 3330, respectively. Exterior, middle and interior layers 110, 120 and 130 were then formed into sheets or webs of material as the pellets were passed through extruders 3310, 3320 and 3330, respectively.

Extruders 3310 and 3330 were 2.5" Davis Standard 30/1 L/D single screw units. Extruders 3310 and 3330 were set up with a temperature profile of about 230° C./230° C./240° C. Extruder 3320 was a 3.5" Davis Standard 30/1 L/D single screw unit. Extruder 3320 was set up with a temperature profile of about 235° C./235° C./245° C.

Exterior, middle and interior layers 110, 120 and 130 were then passed through feedblock and flat coat hanger die 3400 to form a single, three layered sheet or web which comprises backsheet 100. Feedblock/Die 3400 was set at a temperature of about two hundred and forty degrees Celsius (240° C.). Molten backsheet 100 was quenched on three-roll stack 3500, which also imparted a micro-texture surface on the film surface. In this configuration, the process of this invention produced backsheet 100 at rates of about 100 to about 300 pounds per hour. Finished backsheet 100 was then rolled up on master roll windup 3600.

In a second example of the co-extrusion process of the instant invention depicted in FIG. 3, backsheet 100 was manufactured by utilizing three following three layers of material:
(1) an exterior layer 110 (designated as Material A in FIG. 3) of white Surlyn Reflections material comprising about ten percent (10%) $TIO_2$;
(2) a middle layer 120 (designated as Material B in FIG. 3) of PA610 (Dupont RSLC3090) comprising about twenty-five percent (25%) talc filler; and
(3) an interior layer 130 (designated as Material C in FIG. 3) of the same white Surlyn Reflections, comprising about ten percent (10%) $TIO_2$, as that of exterior layer 110.

The Surlyn Reflections material utilized for both exterior layer 110 and interior layer 130 was dried for between about 4 to about 6 hours at about seventy degrees Celsius (70° C.) to bring the moisture content in the materials to below about fifteen hundredths of a percent (0.15%) by weight in desiccant hopper/dryers 3210 and 3230, respectively. The PA610 material utilized for middle layer 120 was dried for between about 4 to about 6 hours at about eighty degrees Celsius (80° C.) to bring the moisture content in the materials to below about five hundredths of a percent (0.05%) by weight in desiccant hopper/dryer 3220.

Dried pellets of each material were conveyed pneumatically from hopper/dryers 3210, 3220 and 3230, respectively, to the corresponding extruders 3310, 3320 and 3330, respectively. Exterior, middle and interior layers 110, 120 and 130 were then formed into sheets or webs of material as the pellets were passed through extruders 3310, 3320 and 3330, respectively.

Extruders 3310 and 3330 were 2.5" Davis Standard 30/1 L/D single screw units. Extruders 3310 and 3330 were set up with a temperature profile of about 230° C./230° C./240° C. Extruder 3320 was a 3.5" Davis Standard 30/1 L/D single screw unit. Extruder 3320 was set up with a temperature profile of about 240° C./250° C./260° C.

Exterior, middle and interior layers 110, 120 and 130 were then passed through feedblock and flat coat hanger die 3400 to form a single, three layered sheet or web which comprises backsheet 100. Feedblock/Die 3400 was set at a temperature of about two hundred and forty degrees Celsius (240° C.). Molten backsheet 100 was quenched on three-roll stack 3500, which also imparted a micro-texture surface on the film surface. In this configuration, the process of this invention produced backsheet 100 at rates of about 100 to about 300 pounds per hour. Finished backsheet 100 was then rolled up on master roll windup 3600.

In a third example of the co-extrusion process of the instant invention depicted in FIG. 3, backsheet 100 was manufactured by utilizing three following three layers of material:
(1) an exterior layer 110 (designated as Material A in FIG. 3) of white Surlyn Reflections material comprising about ten percent (10%) $TIO_2$;
(2) a middle layer 120 (designated as Material B in FIG. 3) of PA11 (ArkemaRilsan) comprising about forty percent (40%) talc filler; and
(3) an interior layer 130 (designated as Material C in FIG. 3) of the same white Surlyn Reflections, comprising about ten percent (10%) $TIO_2$, as that of exterior layer 110.

The Surlyn Reflections material utilized for both exterior layer 110 and interior layer 130 was dried for between about 4 to about 6 hours at about seventy degrees Celsius (70° C.) to bring the moisture content in the materials to below about fifteen hundredths of a percent (0.15%) by weight in desiccant hopper/dryers 3210 and 3230, respectively. The PA11 material utilized for middle layer 120 was dried for between about 4 to about 6 hours at about eighty degrees Celsius (80° C.) to bring the moisture content in the materials to below about five hundredths of a percent (0.05%) by weight in desiccant hopper/dryer 3220.

Dried pellets of each material were conveyed pneumatically from hopper/dryers 3210, 3220 and 3230, respectively, to the corresponding extruders 3310, 3320 and 3330, respectively. Exterior, middle and interior layers 110, 120 and 130 were then formed into sheets or webs of material as the pellets were passed through extruders 3310, 3320 and 3330, respectively.

Extruders 3310 and 3330 were 2.5" Davis Standard 30/1 L/D single screw units. Extruders 3310 and 3330 were set up with a temperature profile of about 230° C./230° C./240° C. Extruder 3320 was a 3.5" Davis Standard 30/1 L/D single screw unit. Extruder 3320 was set up with a temperature profile of about 240° C./250° C./260° C.

Pellets were conveyed pneumatically to the respective extruders. Extruder A and C was 2.5" Davis Standard 30/1 L/D single screw unit. Extruders A & C were setup with a temperature profile of 230 C/230 C/240 C. Extruder B was 3.5" Davis Standard 30/1 L/D single screw unit. Extruders B was setup with a temperature profile of 240 C/250 C/260 C.

Exterior, middle and interior layers 110, 120 and 130 were then passed through feedblock and flat coat hanger die 3400 to form a single, three layered sheet or web which comprises backsheet 100. Feedblock/Die 3400 was set at a temperature of about 250° C. Molten backsheet 100 was quenched on three-roll stack 3500, which also imparted a micro-texture surface on the film surface. In this configuration, the process of this invention produced backsheet 100 at rates of about 100 to about 300 pounds per hour. Finished backsheet 100 was then rolled up on master roll windup 3600.

Feed rates of each extruder were varied to produce backsheets 100 of the following constructions:

| Sample | Outer Layers Material 110 & 130 | Outer Layers 110 & 130 Thickness (mils) | Middle Layer Material 120 | Middle Layer 120 Thickness (mils) |
|---|---|---|---|---|
| 1 | White Surlyn Reflections | 1 | 25% Talc filled PA610 | 4 |
| 2 | White Surlyn Reflections | 0.8 | 25% Talc filled PA610 | 5 |
| 3 | White Surlyn Reflections | 2 | 25% Talc filled PA610 | 3 |
| 4 | Black Surlyn Reflections | 0.5 | 15% Talc filled PA612 | 6 |
| 5 | White Surlyn Reflections | 1 | 25% Talc filled PA612 | 4 |
| 6 | White Surlyn Reflections | 1.25 | 25% Talc filled PA610 | 3 |
| 7 | White Surlyn Reflections | 0.75 | 25% Talc filled PA612 | 4 |
| 8 | White Surlyn Reflections | 2 | 25% Talc filled PA612 | 5 |
| 9 | White Surlyn Reflections | 1 | 15% Talc Filled PA 612 | 5 |
| 10 | Black Surlyn Reflections | 0.8 | 15% Talc Filled PA 612 | 7 |
| 11 | White Surlyn Reflections | 1 | 40% Talc Filled PA 11 | 4 |
| 12 | White Surlyn Reflections | 2 | 40% Talc Filled PA 11 | 6 |

Other extrusion and/or non-adhesive lamination methods for producing backsheet 100 of the instant invention may also be employed such as, for example, blown film methodologies.

Figure 5:
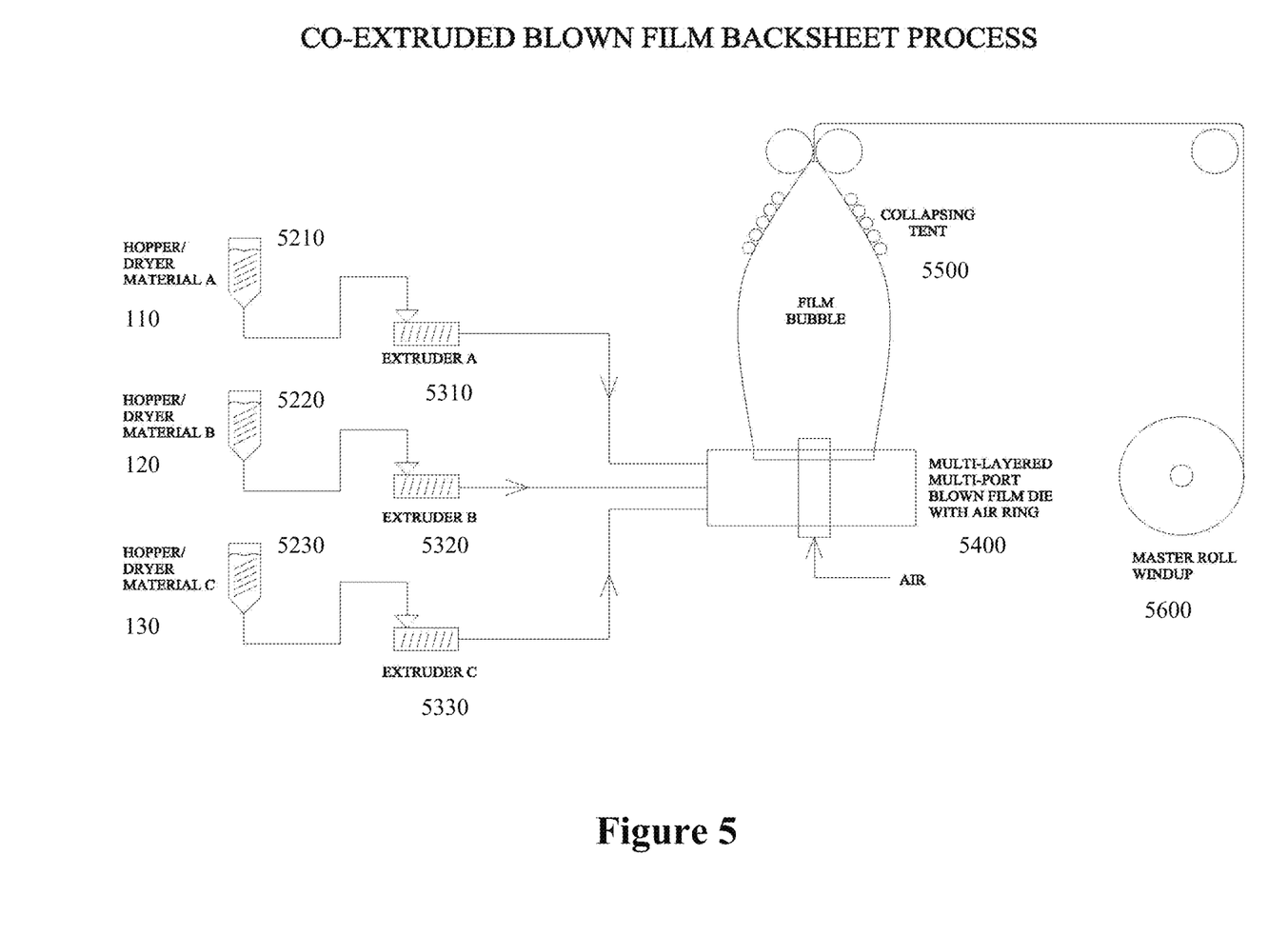
FIG. 5 is a block diagram depicting one embodiment of a method of manufacturing the backsheet of the instant invention via a blown film process.

Turning now to FIG. 5, is shown a block diagram depicting another embodiment of a method for manufacturing backsheet 100 which utilizes a co-extruded blown film process. In one embodiment of the instant invention, when used as exterior layer 110 and interior layer 130 layer, Surlyn Reflections™ has been found to be compatible with other polyamides, such as a talc filled, thermally stable polyamide which may comprise middle layer 120, although other suitable materials may be used for exterior layer 110, middle layer 120 and interior layer 130.

In the blown film process depicted in FIG. 5, the materials utilized for exterior layer 110, middle layer 120 and interior layer 130 are dried in desiccant hopper/dryers 5210, 5220 and 5230, respectively, to bring the moisture content present in each of the materials suitable processing levels.

Dried pellets of each material are then conveyed pneumatically from hopper/dryers 5210, 5220 and 5230, respectively, to corresponding extruders 5310, 5320 and 5330, respectively. Exterior, middle and interior layers 110, 120 and 130 are then formed into sheets or webs of material as the pellets are heated to appropriate temperatures and passed through extruders 5310, 5320 and 5330, respectively. Extruders 5310, 5320 and 5330 may comprise single screw units with temperature profiles being set to suitable levels.

Exterior, middle and interior layers 110, 120 and 130 may then be passed through multi-layered, multi-port blown film die 4400 (which may further comprise an air ring) and collapsing tent 5500 to form a single, three layered sheet or web which comprises backsheet 100. Blown film die 5400 may be set to a suitable temperature which promotes the formation of backsheet 100. Molten backsheet 100 may then be quenched on and a micro-texture surface may also be imparted on surface of backsheet 100. Finished backsheet 100 may then be rolled up on master roll windup 5600.

Although it is preferred that the backsheet of this invention does not utilize adhesives for joining the backsheet layers together, it is possible to employ manufacturing processes which do utilize an amount of suitable adhesive between any two layers of backsheet 100, if desired.

Figure 4:
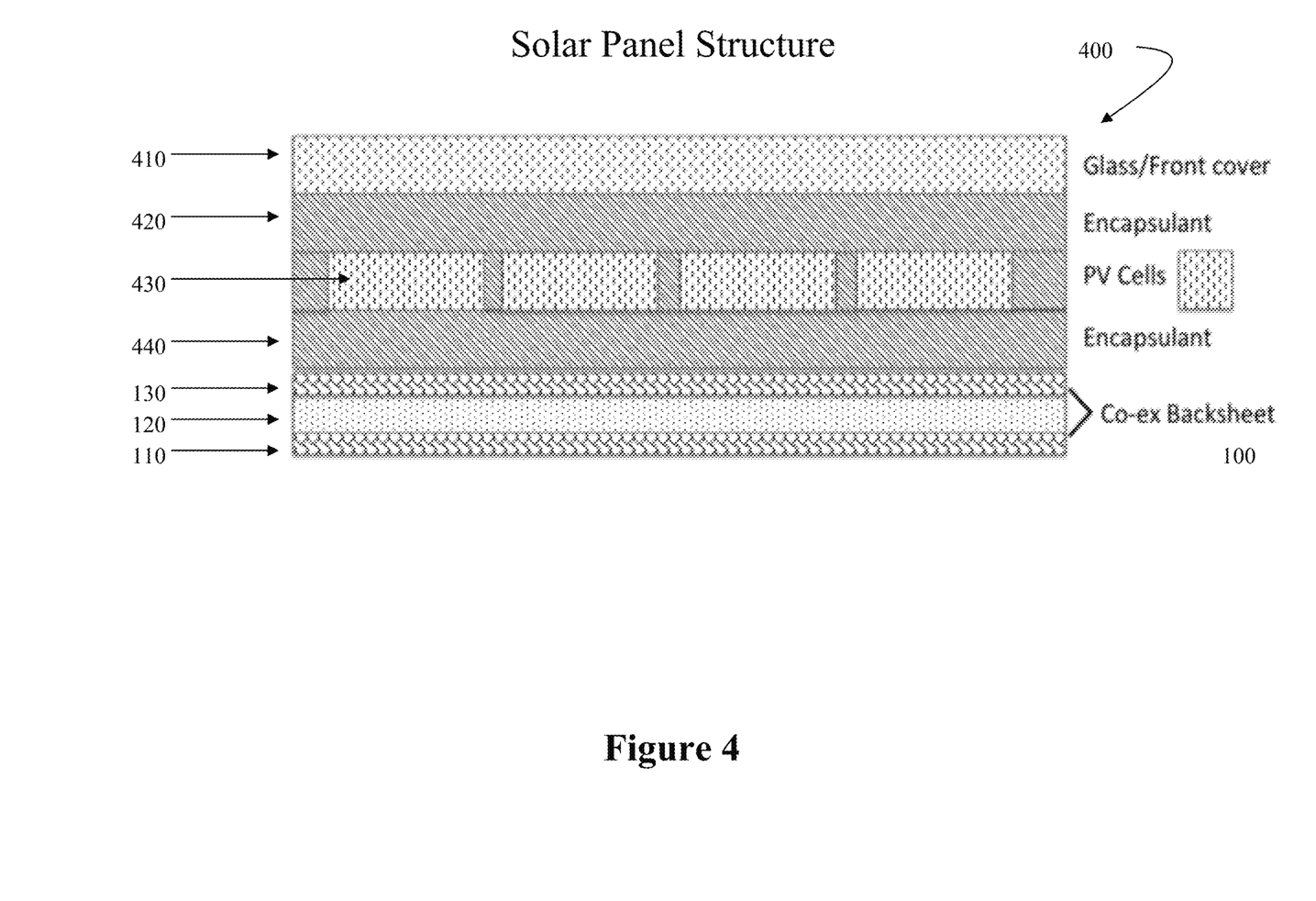
FIG. 4 is a cross sectional schematic depicting a solar cell construction incorporating one embodiment of the solar panel backsheet of the instant invention.

Turning now to FIG. 4, there is shown a cross sectional schematic depicting a solar cell construction 400 which incorporates one embodiment of the solar panel backsheet of the instant invention. Solar cell 400 comprises front cover 410, photovoltaic cells 430 encapsulated in one or more suitable encapsulants 420 and 440, which comprises top encapsulant portion 420 and bottom encapsulant portion 440, and backsheet 100.

Front cover 410 may be constructed from glass or any other suitable material which transmits light to PV cells 430. Encapsulant portions 420 and 440 may comprise a single unitary construction, or may comprise separate encapsulant portions 420 and 440 joined together to encapsulate PV cells 430. Encapsulant portions 420 and 440 may further comprise the same or different material or materials. In one embodiment, top encapsulant portion 420 may comprise a material which protects PV cells 430 but, like front cover 410, also transmits light to PV cells 430. In addition, bottom encapsulant portion 440 may comprise a material which also protects PV cells 430 but also either reflects or absorbs light in a manner which improves the efficiency of PV cells 430.

Also, as shown in the embodiment depicted in FIG. 4, backsheet 100 may comprise three layers: exterior layer 110; middle layer 120; and interior layer 130. Exterior layer 110 may comprise a polyamide and ionomer alloy. Middle layer 120 may comprise a talc filled polyamide. Finally, interior layer 130 may comprise a polyamide and ionomer alloy, which may be the same as or different from the polyamide and ionomer alloy of exterior layer 110.

In this embodiment of backsheet 100, the outer surface of middle layer 120 may be adjoined to the inner surface of exterior layer 110, and the inner surface of middle layer 120 may be adjoined to the outer surface of interior layer 130.

In the embodiment of solar cell 400 depicted in FIG. 4, PV cells 430 are substantially encapsulated in encapsulant 420 and/or 430. The outer surface of encapsulant portion 420 is adjoined to the inner surface of front cover 410. The outer surface of encapsulant portion 440 is adjoined, or otherwise affixed to, the inner surface of backsheet interior layer 130.

The disclosure herein is directed to the variations and modifications of the elements and methods of the invention disclosed and that will be apparent to those skilled in the art in light of the disclosure herein. Thus, it is intended that the present invention covers the modifications and variations of this invention, provided those modifications and variations come within the scope of the appended claims and the equivalents thereof.

What is claimed is:

1. A photovoltaic solar panel backsheet comprising:
   an exterior layer having substantially planar inner and outer surfaces said exterior layer comprising a non-grafted polyamide and ionomer alloy;
   a middle layer, having inner and outer surfaces comprising a polyamide; and
   an interior layer having inner and outer surfaces;
   wherein said outer surface of said middle layer is directly adjoined to said inner surface of said exterior layer without adhesive, and said inner surface of said middle layer is directly adjoined to said outer surface of said interior layer without adhesive.

2. The photovoltaic solar panel backsheet of claim 1, wherein said interior layer comprises a non-grafted polyamide and ionomer alloy.

3. The photovoltaic solar panel backsheet of claim 1, wherein said interior layer and said exterior layer each have a thickness of between about 0.5 mils and about eight (8) mils.

4. The photovoltaic solar panel backsheet of claim 1, wherein said middle layer has a thickness of between about three (3) mils and about seven (7) mils.

5. The photovoltaic solar panel backsheet of claim 1, wherein said middle layer comprises at least one of a PA11, PA12, PA610, or PA612.

6. The photovoltaic solar panel backsheet of claim 1, wherein said middle layer comprises filler between about five percent (5%) by weight and about forty percent (40%) by weight.

7. The photovoltaic solar panel backsheet of claim 1, wherein said middle layer comprises at least one of a talc filled polyamide, calcium carbonate filled polyamide, or a talc and calcium carbonate filled polyamide.

8. A method for manufacturing a photovoltaic solar panel backsheet, comprising the steps of:
   drying an exterior layer material comprising a non-grafted polyamide and ionomer alloy, a middle layer material comprising a talc filled polyamide, and an interior layer material comprising a polyamide and ionomer alloy;
   heating said exterior, middle and interior layer materials to a state wherein each of said materials may be extruded into individual sheets or webs;
   extruding said exterior, middle and interior layer materials into individual sheets or webs;
   forming said backsheet comprising a single, three layered sheet or web which comprises said exterior layer material sheet or web having substantially planar inner and outer surfaces, said middle layer material sheet or web having inner and outer surfaces; and said interior layer sheet or web having inner and outer surfaces;
   wherein said outer surface of said middle layer sheet or web is directly adjoined to said inner surface of said exterior layer sheet or web without adhesive, and said inner surface of said middle layer is directly adjoined to said outer surface of said interior layer sheet or web without adhesive.

9. The method of claim 8, wherein said method comprises a co-extrusion process.

10. The method of claim 9, wherein said co-extrusion process comprises at least one of a co-extruded cast film process and a co-extruded blown film process.

11. A photovoltaic solar panel module comprising:
    a front cover having inner and outer surfaces;
    one or more photovoltaic cells substantially encapsulated in an encapsulant having a top outer surface and a bottom outer surface;
    a backsheet comprising: an exterior layer having substantially planar inner and outer surfaces; a middle layer, having inner and outer surfaces; and an interior layer having inner and outer surfaces; wherein said outer surface of said middle layer is directly adjoined to said inner surface of said exterior layer without adhesive, and said inner surface of said middle layer is directly adjoined to said outer surface of said interior layer without adhesive; and
    wherein said top outer surface of said encapsulant is adjoined to said inner surface of said front cover, and said bottom outer surface of said encapsulant is adjoined to said inner surface of said interior layer of said backsheet, and wherein one or both of said exterior and interior backsheet layers comprise a non-grafted polyamide and ionomer alloy, and said middle layer comprises a polyamide.

12. The photovoltaic solar panel module of claim 11, wherein said middle layer comprises at least one of a talc filled polyamide, calcium carbonate filled polyamide, or a talc and calcium carbonate filled polyamide.

13. The photovoltaic solar panel module of claim 11, wherein said encapsulant comprises a top portion comprising said top outer surface of said encapsulant, and a bottom portion comprising said bottom outer surface of said encapsulant.

14. The photovoltaic solar panel module of claim 13, wherein said top portion of said encapsulant comprises substantially the same material composition as said bottom portion of said encapsulant.

15. The photovoltaic solar panel module of claim 13, wherein said top portion of said encapsulant comprises a substantially different material composition as said bottom portion of said encapsulant.

16. The photovoltaic solar panel module of claim 13, wherein said top portion of said encapsulant comprises a material composition which permits light to pass through said top portion of said encapsulant sufficient to activate said one or more photovoltaic cells, and said bottom portion of said encapsulant comprises a material composition which reflects at least partially reflects light to increase said one or more photovoltaic cells operating efficiency.

17. A photovoltaic solar panel backsheet comprising:
    an exterior layer having substantially planar inner and outer surfaces;
    a middle layer comprising a polyamide and having inner and outer surfaces; and
    an interior layer having inner and outer surfaces comprising a non-grafted polyamide and ionomer alloy;
    wherein said outer surface of said middle layer is directly adjoined to said inner surface of said exterior layer without adhesive, and said inner surface of said middle layer is directly adjoined to said outer surface of said interior layer without adhesive.

18. The photovoltaic solar panel backsheet of claim 17, wherein said middle layer comprises a polymeric material.

19. The photovoltaic solar panel backsheet of claim 1, wherein said middle layer comprises a polymeric material.

20. The photovoltaic solar panel module of claim 11, wherein said middle layer of said backsheet comprises a polymeric material.

21. The photovoltaic solar panel backsheet of claim 1, wherein, said outer surface of said inner layer is constructed to be directly adjoined to an outer surface an encapsulant substantially encapsulating one or more photovoltaic cells.

22. The photovoltaic solar panel backsheet of claim 17, wherein said outer surface of said inner layer is constructed to be directly adjoined to an outer surface an encapsulant substantially encapsulating one or more photovoltaic cells.

* * * * *